(12) United States Patent
Kobayashi et al.

(10) Patent No.: US 10,594,272 B2
(45) Date of Patent: Mar. 17, 2020

(54) GALLIUM NITRIDE POWER AMPLIFIER

(71) Applicant: Qorvo US, Inc., Greensboro, NC (US)

(72) Inventors: Kevin Wesley Kobayashi, Redondo Beach, CA (US); Dan Denninghoff, Thousand Oaks, CA (US); Jose Jimenez, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/847,088

(22) Filed: Dec. 19, 2017

(65) Prior Publication Data

US 2018/0183392 A1 Jun. 28, 2018

Related U.S. Application Data

(60) Provisional application No. 62/437,797, filed on Dec. 22, 2016.

(51) Int. Cl.
| | | |
|---|---|---|
| *H03F 3/68* | (2006.01) | |
| *H03F 1/56* | (2006.01) | |
| *H03F 3/195* | (2006.01) | |
| *H03F 3/213* | (2006.01) | |
| *H01L 29/40* | (2006.01) | |
| *H01L 29/78* | (2006.01) | |

(Continued)

(52) U.S. Cl.
CPC ............ *H03F 1/56* (2013.01); *H01L 21/8252* (2013.01); *H01L 27/0207* (2013.01); *H01L 27/085* (2013.01); *H01L 27/088* (2013.01); *H01L 29/402* (2013.01); *H01L 29/404* (2013.01); *H01L 29/41775* (2013.01); *H01L 29/778* (2013.01); *H01L 29/78* (2013.01); *H03F 3/195* (2013.01); *H03F 3/213* (2013.01); *H03F 3/604* (2013.01); *H01L 29/2003* (2013.01); *H01L 29/41725* (2013.01); *H03F 2200/192* (2013.01); *H03F 2200/204* (2013.01); *H03F 2200/222* (2013.01); *H03F 2200/318* (2013.01); *H03F 2200/387* (2013.01); *H03F 2200/411* (2013.01); *H03F 2200/451* (2013.01)

(58) Field of Classification Search
CPC . H03F 1/56; H03F 3/604; H03F 3/213; H03F 3/195
USPC ......... 330/53, 54, 98, 295, 124 R, 286, 310, 330/302, 307
See application file for complete search history.

(56) References Cited

U.S. PATENT DOCUMENTS

| | | | | |
|---|---|---|---|---|
| 9,496,836 | B2 * | 11/2016 | Qureshi | H03F 3/193 |
| 2017/0264247 | A1 * | 9/2017 | Nishimori | H03F 1/0288 |

OTHER PUBLICATIONS

Levy, Cooper, et al., "A 6-41 GHz Distributed Amplifier with Supply Scaling for Efficiency Enhancement," 2015 IEEE Compound Semiconductor Integrated Circuit Symposium, New Orleans, Louisiana, 2015, 4 pages.

* cited by examiner

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

A gallium nitride (GaN) power amplifier having a plurality of amplifier stages integrated into a monolithic integrated circuit is disclosed. The plurality of amplifier stages is coupled together between a radio frequency signal input and a radio frequency signal output, wherein at least one of the plurality of amplifier stages includes a first GaN transistor that is configured to have a first breakdown voltage that is no (Continued)

more than 75% of a second breakdown voltage of a second GaN transistor included in a different one of the plurality of amplifier stages.

22 Claims, 7 Drawing Sheets

(51) Int. Cl.
*H01L 27/088* (2006.01)
*H03F 3/60* (2006.01)
*H01L 27/02* (2006.01)
*H01L 27/085* (2006.01)
*H01L 21/8252* (2006.01)
*H01L 29/417* (2006.01)
*H01L 29/778* (2006.01)
*H01L 29/20* (2006.01)

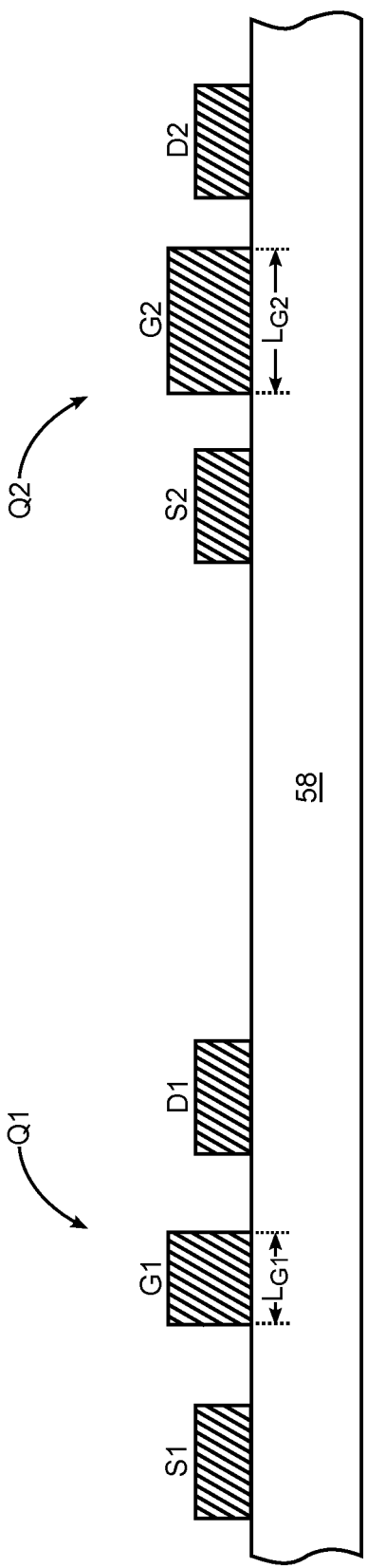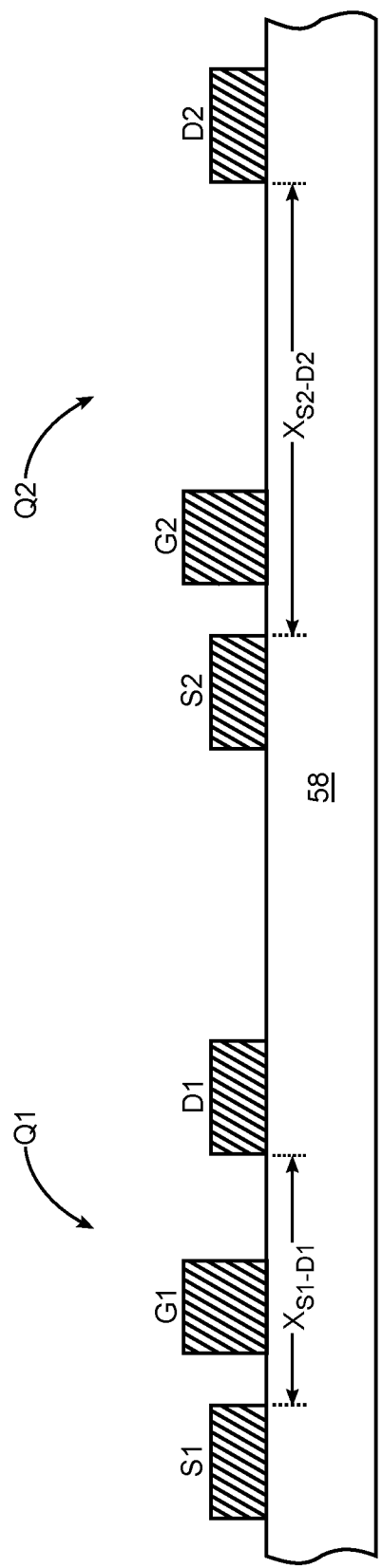

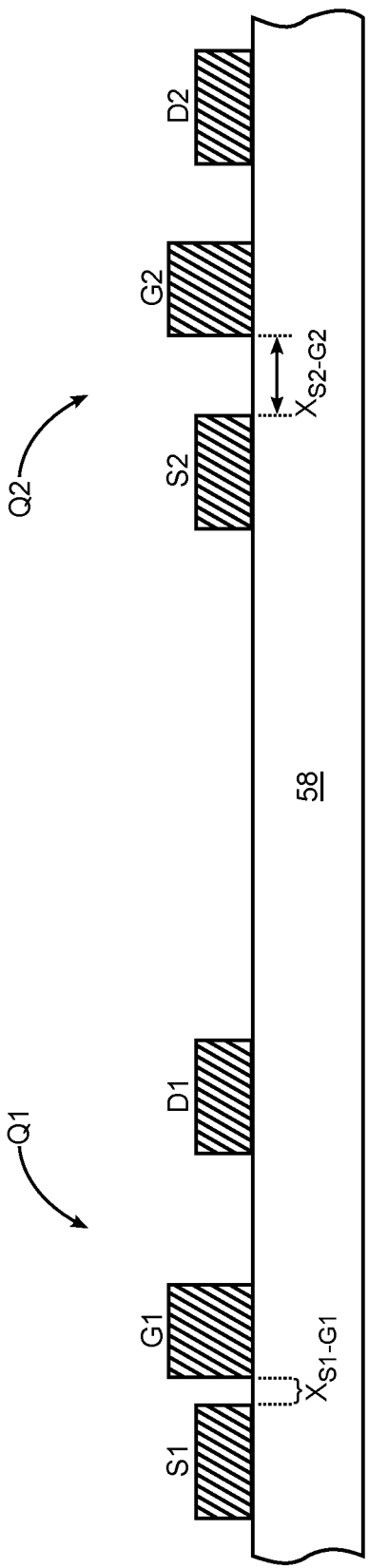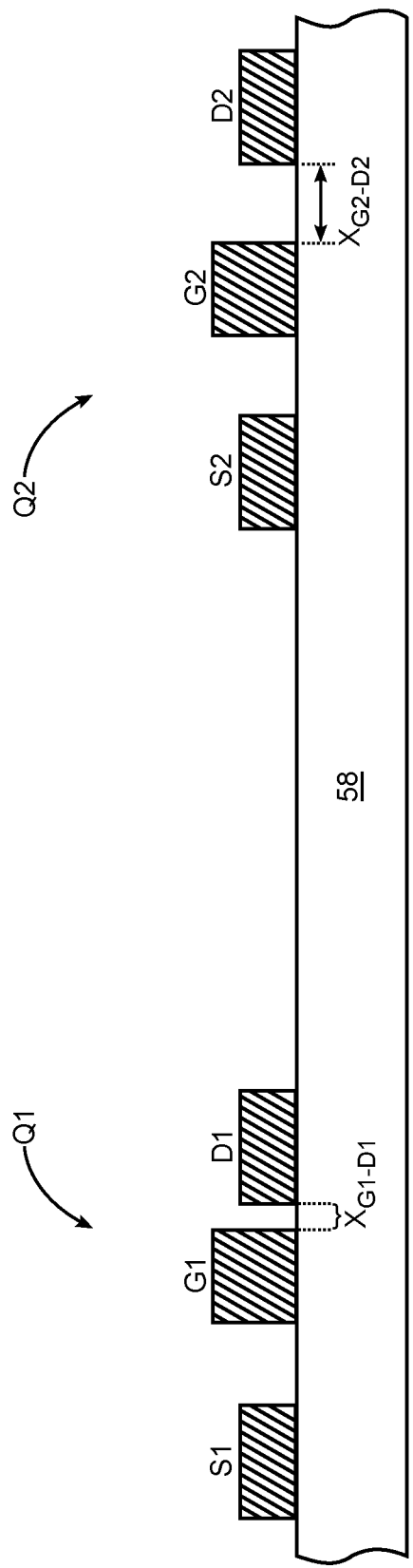

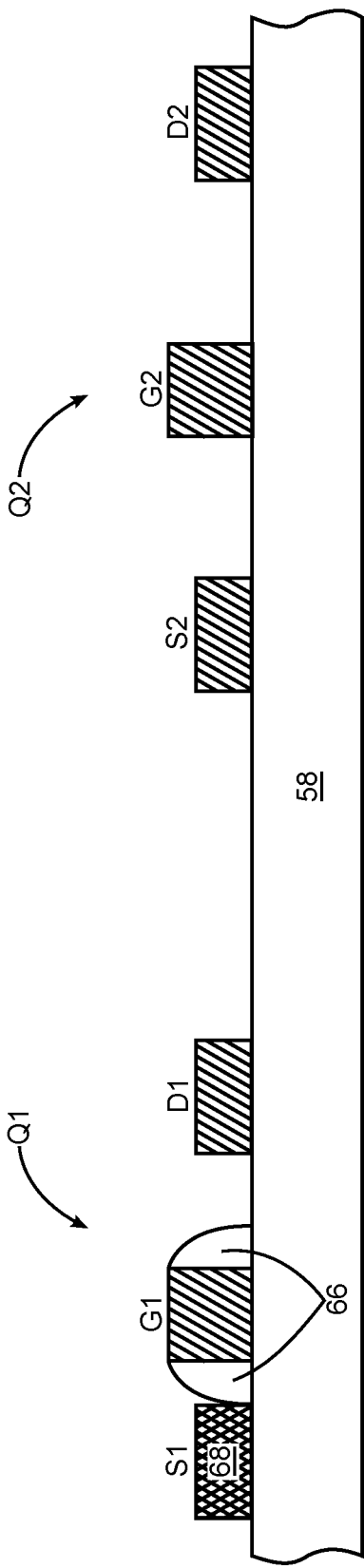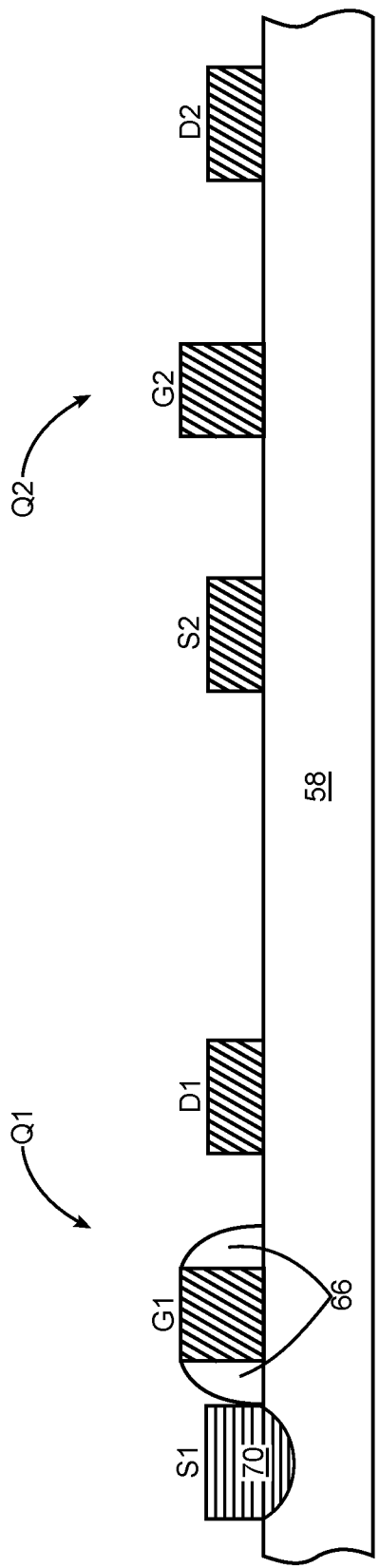

GALLIUM NITRIDE POWER AMPLIFIER

RELATED APPLICATIONS

This application claims the benefit of provisional patent application Ser. No. 62/437,797, filed Dec. 22, 2016, the disclosure of which is hereby incorporated herein by reference in its entirety.

FIELD OF THE DISCLOSURE

The present disclosure generally relates to radio frequency amplifiers and in particular to gallium nitride power amplifiers.

BACKGROUND

Linearization of a radio frequency (RF) power amplifier is an important design technique to achieve a high linearity of an RF power amplifier. The term "linearity" refers to the ability of the amplifier to produce signals that are accurate copies of the input but at increased power levels. In an ideal RF power amplifier, a transfer function that describes the relationship of input power to output power is linear. In actual RF power amplifiers, the transfer function is a non-linear function. Typically, as the input power increases, the amplifier has more and more difficulty maintaining the same level of amplification, that is, the gain begins to drop. When the output of the amplifier differs from the input, this difference introduces distortion into the output. For example, when the output of an RF power amplifier is clipped, this introduces high-frequency components into the output signal that were not present in the input signal. Thus, in real (not simulated or ideal) RF power amplifiers, the gain is a non-linear function that varies with input signal level.

To address the issue of gain being a non-linear function that varies with input signal level, an RF frequency power amplifier is generally made up of amplifier stages that are each configured to provide portions of a total gain. Due to ever-increasing spacing requirements, it is advantageous to fabricate the plurality of amplifier stages on a monolithic integrated circuit using gallium nitride (GaN) technology. However, heretofore maximizing both linearity and efficiency of a plurality of amplifier stages on a monolithic integrated circuit using GaN technology has been unrealized. Thus, a need remains for a GaN power amplifier that has a plurality of amplifier stages fabricated into a monolithic integrated circuit that maximizes both linearity and efficiency.

SUMMARY

A gallium nitride (GaN) power amplifier having a plurality of amplifier stages integrated into a monolithic integrated circuit is disclosed. The plurality of amplifier stages is coupled together between a radio frequency signal input and a radio frequency signal output, wherein at least one of the plurality of amplifier stages includes a first GaN transistor that is configured to have a first breakdown voltage that is no more than 75% of a second breakdown voltage of a second GaN transistor included in a different one of the plurality of amplifier stages. In at least some embodiments, this first GaN transistor will operate more linear efficient at a lower drain supply voltage enabling improved overall linear efficient operation of the GaN power amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 4 is a cross-sectional view of the first GaN transistor and the second GaN transistor arranged on a common substrate, wherein the first gate has a first gate length that is significantly less than a second gate length of the second gate.

FIG. 5 is a cross-sectional view of the first GaN transistor and the second GaN transistor arranged on the common substrate, wherein the first source and the first drain are laterally separated by a first distance that is significantly less than a second distance laterally separating the second source from the second drain.

FIG. 6 is a cross-sectional view of the first GaN transistor and the second GaN transistor arranged on the common substrate, wherein the first source and the first gate are laterally separated by a first distance that is significantly less than a second distance laterally separating the second source from the second gate.

FIG. 7 is a cross-sectional view of the first GaN transistor and the second GaN transistor arranged on the common substrate, wherein the first gate and the first drain are laterally separated by a first distance that is significantly less than a second distance laterally separating the second gate from the second drain.

FIG. 12 is a cross-sectional view of the first GaN transistor and the second GaN transistor arranged on the common substrate in which the first source of the first transistor has a selective epitaxially regrown contact.

FIG. 13 is a cross-sectional view of the first GaN transistor and the second GaN transistor arranged on the common substrate in which the first source of the first transistor has an ion implanted contact to provide lower channel resistance and contact resistance for lower knee voltage and drain voltage linear device operation.

DETAILED DESCRIPTION

Figure 1:
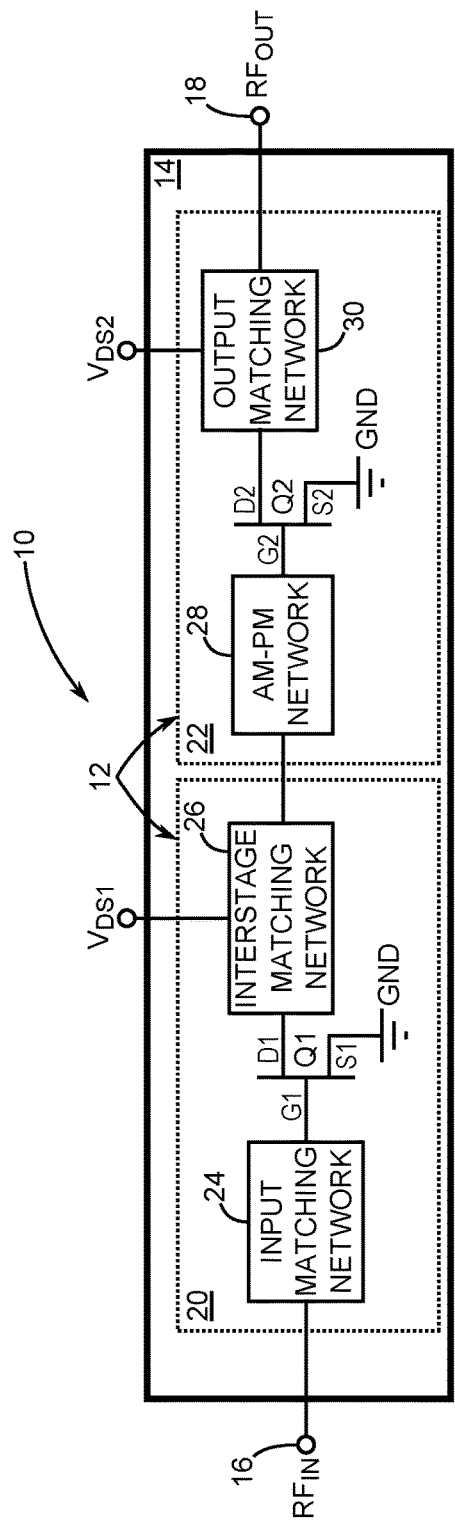
FIG. 1 is a schematic of a first embodiment of a gallium nitride (GaN) power amplifier that includes a plurality of cascaded amplifier stages integrated into a monolithic integrated circuit in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In general, the present disclosure provides a gallium nitride (GaN) power amplifier (PA) having a plurality of amplifier stages fabricated into a monolithic integrated circuit that maximizes both linearity and efficiency. In particular, individual ones of the plurality of amplifier stages of the present disclosure are configured to operate from different supply voltages that are made available within the monolithic integrated circuit. Moreover, GaN transistors making up amplifier stages operating at lower supply voltages relative to other GaN transistors making up amplifier stages that operate at higher supply voltages are configured to have breakdown voltages and/or knee voltages that are lower relative to the breakdown voltages and/or knee voltages of the GaN transistors that operate at the higher supply voltages.

FIG. 1 is a schematic of a first embodiment of a GaN PA 10 that includes a plurality of amplifier stages 12 integrated into a monolithic integrated circuit 14 and coupled together between a radio frequency (RF) signal input 16 and an RF signal output 18. In this exemplary embodiment, a first amplifier stage 20 of the plurality of amplifier stages 12 includes a first GaN transistor Q1 that is configured to have a first breakdown voltage that is no more than 75% of a second breakdown voltage of a second GaN transistor Q2 included in a second amplifier stage 22 of the plurality of amplifier stages 12. In exemplary embodiments, the GaN transistors of the present disclosure such as the first GaN transistor Q1 and the second GaN transistor Q2 are high electron mobility transistors. Moreover, the GaN transistors of the present disclosure can be fabricated on either of silicon-on-insulator or silicon substrates.

In this particular embodiment, the plurality of amplifier stages 12 is arranged in a cascaded PA topology in which output from the first amplifier stage 20 is input to the second amplifier stage 22. The first amplifier stage 20 has an input matching network 24 that is coupled between the RF signal input 16 and a first gate G1 of the first GaN transistor Q1. The input matching network 24 matches output impedance of external circuitry coupled to the RF signal input 16 to the input impedance of the first GaN transistor Q1. An interstage matching network 26 matches output impedance of the first amplifier stage 20 to input impedance of the second amplifier stage 22. The interstage matching network 26 is coupled between a first drain D1 of the first GaN transistor Q1 and a second gate G2 of the second GaN transistor Q2. The interstage matching network 26 may include a bias tee (not shown) that couples a first supply terminal $V_{DS1}$ to the first amplifier stage 20 to bias the first GaN transistor Q1 with a first supply voltage that is applied to the first supply terminal $V_{DS1}$ during operation.

In this exemplary embodiment, the second amplifier stage 22 includes an amplitude modulation (AM)-phase modulation (PM) network 28 that provides additional impedance transformation directed to maximizing AM-PM linearity. In this particular embodiment the AM-PM network 28 is coupled between the interstage matching network 26 and the second gate G2 of the second GaN transistor Q2. An output matching network 30 is coupled between a second drain D2 of the second GaN transistor Q2 and the RF signal output 18. The output matching network 30 matches output impedance of the second GaN transistor Q2 with input impedance of an external load such as a 50Ω load. The output matching network 30 may include a bias tee (not shown) that couples a second supply terminal $V_{DS2}$ to the second amplifier stage 22 to bias the second GaN transistor Q2 with a second supply voltage that is applied to the second supply terminal $V_{DS2}$ during operation. In this exemplary embodiment, a first source S1 of the first GaN transistor and a second source S2 of the second GaN transistor are both coupled to a fixed voltage node such as ground GND.

In general, predetermined ones of the plurality of amplifier stages 12 are configured to operate from supply voltages that are at least 25% different in voltage level from each other. In the exemplary embodiment only the first amplifier stage 20 and the second amplifier stage 22 make up the plurality of amplifier stages 12. Thus, in this exemplary embodiment, the first supply terminal $V_{DS1}$ and the second supply terminal $V_{DS2}$ are configured to receive voltages that are at least 25% different in voltage level from each other. As such, the first GaN transistor Q1 is configured to have a first breakdown voltage that is no more than 75% of a second breakdown voltage of the second GaN transistor Q2. While the exemplary embodiments are illustrated as having two amplifier stages, it is to be understood that embodiments of the present disclosure may comprise a plurality of amplifier stages made up of any finite number of amplifier stages that operate from up to an equal number of different supply voltages.

Figure 2:
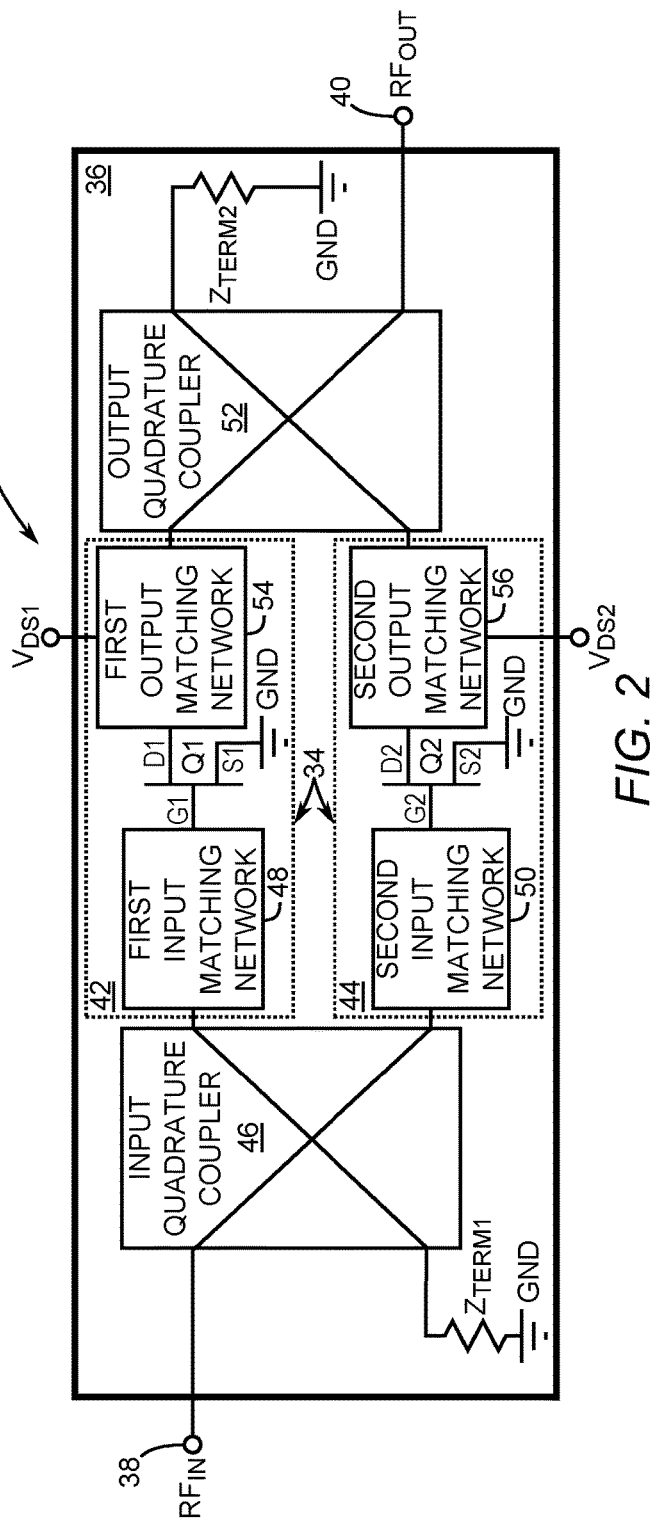
FIG. 2 is a schematic of a second embodiment of the GaN power amplifier that includes a plurality of parallel amplifier stages integrated into a monolithic integrated circuit in accordance with the present disclosure.

FIG. 2 is a schematic of an embodiment of a GaN PA 32 that includes a plurality of amplifier stages 34 integrated into a monolithic integrated circuit 36 in accordance with the present disclosure. In this exemplary embodiment, the plurality of amplifier stages 34 is coupled between an RF signal input 38 and an RF signal output 40. In this exemplary embodiment, a first amplifier stage 42 of the plurality of amplifier stages 34 includes the first GaN transistor Q1 that is configured to have the first breakdown voltage that is no more than 75% of the second breakdown voltage of the second GaN transistor Q2 included in a second amplifier stage 44 of the plurality of amplifier stages 34. In this particular embodiment, the plurality of amplifier stages 34 is arranged in a parallel PA topology in which output from the first amplifier stage 42 is combined with output of the second amplifier stage 44.

In this exemplary embodiment, an input quadrature coupler 46 couples inputs of both the first amplifier stage 42 and the second amplifier stage 44 to the RF signal input 38. The input quadrature coupler 46 may be of the 180 degree hybrid type. The input quadrature coupler 46 may also couple to termination impedance $Z_{TERM1}$. During operation, the input quadrature coupler 46 divides an RF signal input applied to the RF signal input 38 between the first amplifier stage 42 and the second amplifier stage 44 such that the first amplifier stage 42 amplifies a first portion of the RF signal and the second amplifier stage 44 amplifies a second portion of the RF signal.

The first amplifier stage 42 has a first input matching network 48 coupled between the input quadrature coupler 46 and the first gate G1 of the first GaN transistor Q1. The first input matching network 48 matches output impedance of the input quadrature coupler 46 and external circuitry coupled to the RF signal input 38 to the input impedance of the first GaN transistor Q1.

The second amplifier stage 44 has a second input matching network 50 that is coupled between the input quadrature coupler 46 and the second gate G2 of the second GaN transistor Q2. The second input matching network 50 matches output impedance of the input quadrature coupler 46 and external circuitry coupled to the RF signal input 38 to the input impedance of the second GaN transistor Q2.

An output quadrature coupler 52 couples outputs of both the first amplifier stage 42 and the second amplifier stage 44 to the RF signal output 40. The output quadrature coupler can be of the 180 degree hybrid type. During operation, the output quadrature coupler 52 combines output power from both the first amplifier stage 42 and the second amplifier stage 44 and provides the combined output power to an external load that couples to the RF signal output 40. A second termination impedance $Z_{TERM2}$ may also couple to the output quadrature coupler 52.

A first output matching network 54 is coupled between the output quadrature coupler 52 and the first drain D1 of the first GaN transistor Q1. The first output matching network 54 matches output impedance of the first GaN transistor Q1 and impedance of the output quadrature coupler 52 to the external load, such as a 50Ω load, coupled to the RF signal output 40. The first output matching network 54 may include a bias tee (not shown) that couples the first supply terminal $V_{DS1}$ to the first amplifier stage 20 to bias the first GaN transistor Q1 with a first supply voltage that is applied to the first supply terminal $V_{DS1}$ during operation.

A second output matching network 56 is coupled between the output quadrature coupler 52 and the second drain D2 of the second GaN transistor Q2. The second output matching network 56 matches output impedance of the second GaN transistor Q2 and impedance of the output quadrature coupler 52 to the external load coupled to the RF signal output 40. The second output matching network 56 may include a bias tee (not shown) that couples the second supply terminal $V_{DS2}$ to the second amplifier stage 22 to bias the second GaN transistor Q2 with a second supply voltage that is applied to the second supply terminal $V_{DS2}$ during operation.

In this exemplary embodiment of FIG. 2, the first supply terminal $V_{DS1}$ and the second supply terminal $V_{DS2}$ are configured to receive supply voltages that are at least 25% different in voltage level from each other. As such, the first GaN transistor Q1 is allowed to be configured to have a first breakdown voltage that is no more than 75% of a second breakdown voltage of the second GaN transistor Q2. Moreover, in this exemplary embodiment, the first source S1 of the first GaN transistor and the second source S2 of the second GaN transistor are both coupled to a fixed voltage node such as ground GND.

Figure 3:
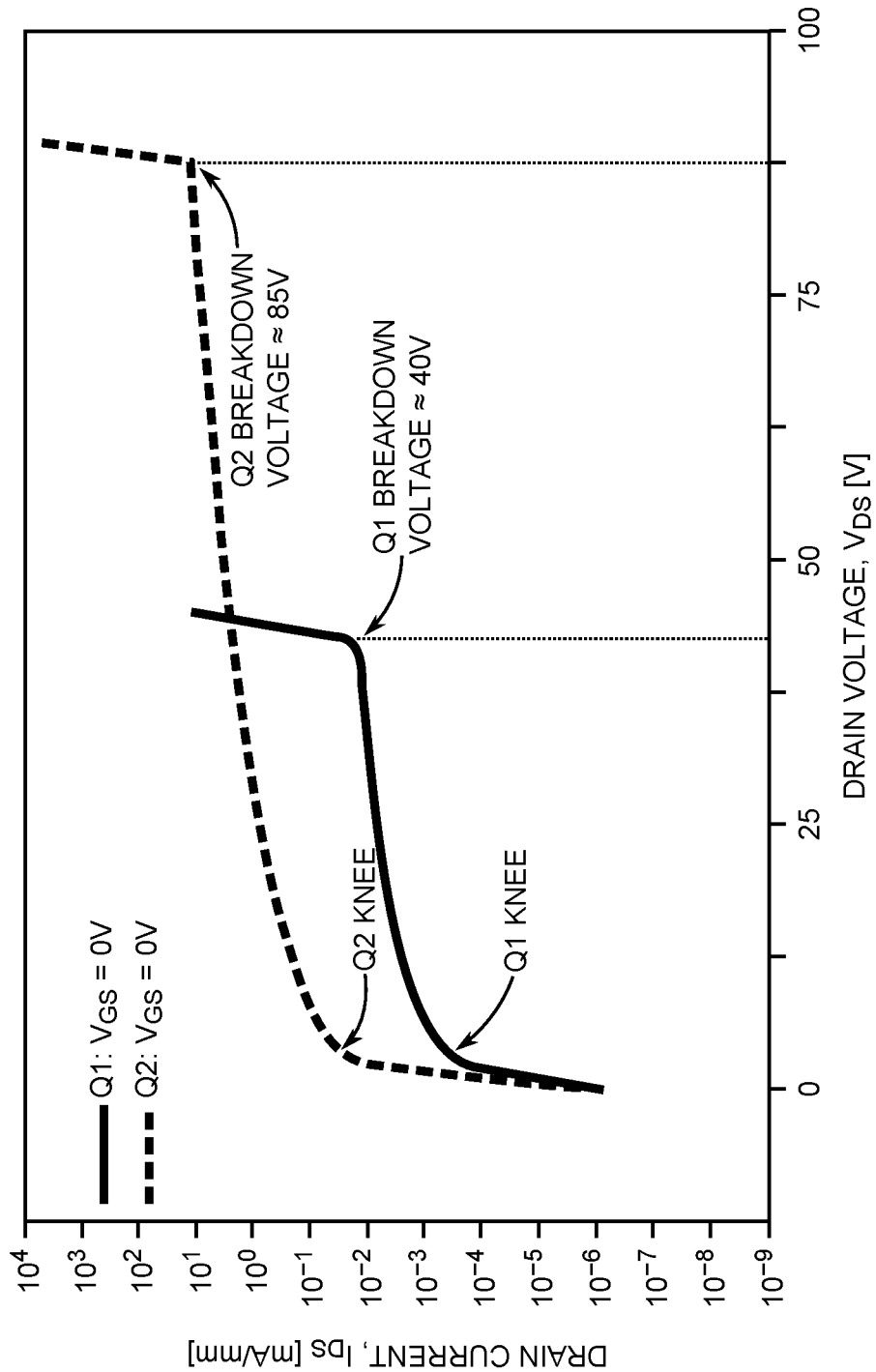
FIG. 3 is an exemplary drain curves graph showing characteristic differences between a first GaN transistor and a second GaN transistor in accordance with the present disclosure.

FIG. 3 is an exemplary drain curves graph showing characteristic differences between the first GaN transistor Q1 and the second GaN transistor Q2 depicted in FIG. 1 and FIG. 2. A drain curve for the first GaN transistor Q1 depicted in solid line has a knee and a breakdown voltage that are both lower in comparison with a drain curve for the second GaN transistor Q2 depicted in dashed line. For the first embodiment depicted in FIG. 1, the lower knee for the first GaN transistor Q1 provides a better impedance match between external circuitry (not shown) coupled to the RF signal input 16 and the first amplifier stage 20 than is possible if the higher knee characteristic of the second GaN transistor Q2 were employed for the first GaN transistor Q1. In some embodiments, the lower knee characteristic is between 25% and 50% lower than the higher knee characteristic. In some embodiments, the lower knee characteristic is between 50% and 75% lower than the higher knee characteristic.

Moreover, both the GaN PA 10 of FIG. 1 and the GaN PA 32 of FIG. 2 have other benefits of operating at significantly different supply voltages. For example, in the exemplary drain curves of FIG. 3, the breakdown voltage of 85 V of the second GaN transistor Q2 versus the breakdown voltage of 40 V of the first GaN transistor Q1 allows the second GaN transistor Q2 to be operated at a supply voltage that is at least twice the supply voltage used for the operation of the first GaN transistor Q1. As a result, the area real estate taken up by either of the GaN PA 10 and the GaN PA 32 is less than what would be required if both the first GaN transistor Q1 and the second GaN transistor Q2 were configured to operate traditionally from one supply voltage.

To configure GaN transistors such that the first GaN transistor Q1 and the second GaN transistor Q2 have different knees and different breakdown voltages for linear operation at different supply voltages on a single monolithic integrated circuit, various transistor structures are disclosed herein. FIG. 4 is a cross-sectional view of the first GaN transistor Q1 and the second GaN transistor Q2 arranged on a common substrate 58, wherein the first gate G1 has a first gate length $L_{G1}$ that is significantly less than a second gate length $L_{G2}$ of the second gate G2. In some embodiments, the first gate length $L_{G1}$ is between 10% and 50% as long as the second gate length $L_{G2}$. In other embodiments, the first gate length $L_{G1}$ is between 50% and 75% as long as the second gate length $L_{G2}$. In the following embodiments, the first gate length and the second gate length are equal to each other within ±1%.

FIG. 5 is a cross-sectional view of the first GaN transistor Q1 and the second GaN transistor Q2 arranged on the common substrate 58, wherein the first source S1 and the first drain D1 are laterally separated by a first distance $X_{S1-D1}$ that is significantly less than a second distance $X_{S2-D2}$ laterally separating the second source S2 from the second drain D2. In some embodiments, the first distance $X_{S1-D1}$ laterally separating the first source S1 from the first drain D1 is between 10% and 50% of the second distance $X_{S2-D2}$ laterally separating the second source S2 from the second drain D2. In other embodiments, the first distance $X_{S1-D1}$ laterally separating the first source S1 from the first drain D1 is between 50% and 75% of the second distance $X_{S2-D2}$ laterally separating the second source S2 from the second drain D2.

FIG. 6 is a cross-sectional view of the first GaN transistor Q1 and the second GaN transistor Q2 arranged on the common substrate 58, wherein the first source S1 and the first gate G1 are laterally separated by a first distance $X_{S1}$-G1 that is significantly less than a second distance $X_{S2-G2}$ laterally separating the second source S2 from the second gate G2. In some embodiments, the first distance $X_{S1-G1}$ laterally separating the first source S1 from the first gate G1 is between 10% and 50% of the second distance $X_{S2-G2}$ laterally separating the second source S2 from the second gate G2. In other embodiments, the first distance $X_{S1-G1}$ laterally separating the first source S1 from the first gate G1 is between 50% and 75% of the second distance $X_{S2-G2}$ laterally separating the second source S2 from the second gate G2.

FIG. 7 is a cross-sectional view of the first GaN transistor Q1 and the second GaN transistor Q2 arranged on the common substrate 58, wherein the first gate G1 and the first drain D1 are laterally separated by a first distance $X_{G1}$-D1 that is significantly less than a second distance $X_{G2-D2}$ laterally separating the second gate G2 from the second drain D2. In some embodiments, the first distance $X_{G1-D1}$ laterally separating the first gate G1 from the first drain D1 is between 10% and 50% of the second distance $X_{G2-D2}$ laterally separating the second gate G2 from the second drain D2. In other embodiments, the first distance $X_{G1-D1}$ laterally separating the first gate G1 from the first drain D1 is between 50% and 75% of the second distance $X_{G2-D2}$ laterally separating the second gate G2 from the second drain D2.

Figure 8:
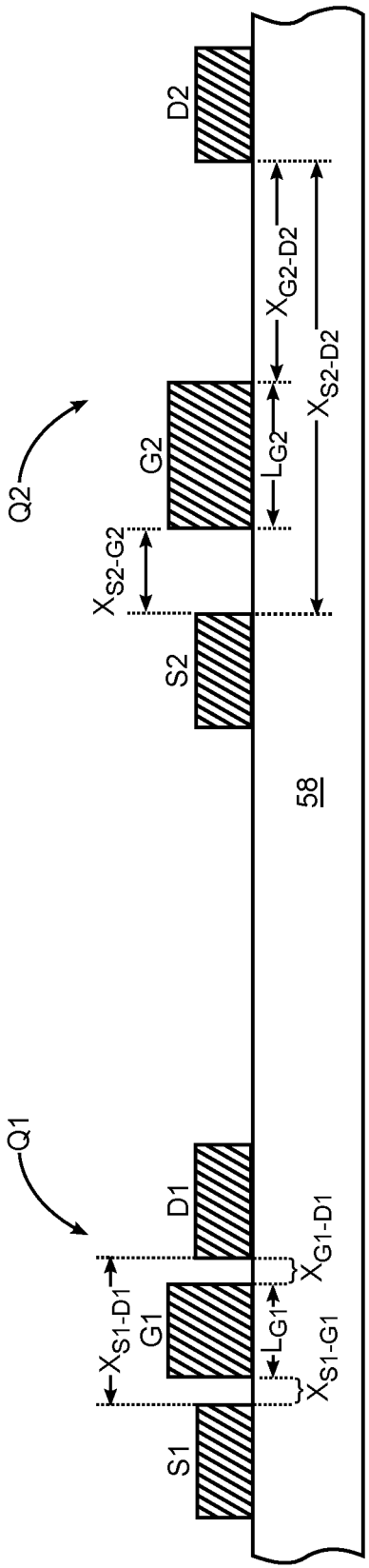
FIG. 8 is a cross-sectional view of the first GaN transistor and the second GaN transistor arranged on the common substrate such that features disclosed in the exemplary embodiments of FIGS. 4-7 are combined into a single exemplary embodiment.

FIG. 8 is a cross-sectional view of the first GaN transistor Q1 and the second GaN transistor Q2 arranged on the common substrate 58 such that features disclosed in the exemplary embodiments of FIGS. 4-7 are combined into a single exemplary embodiment. In this particular exemplary embodiment, the first gate G1 has a first gate length $L_{G1}$ that is significantly less than a second gate length $L_{G2}$ of the second gate G2. In some embodiments, the first gate length $L_{G1}$ is between 10% and 50% as long as the second gate length $L_{G2}$. In other embodiments, the first gate length $L_{G1}$ is between 50% and 75% as long as the second gate length $L_{G2}$. Moreover, the first source S1 and the first drain D1 are laterally separated by a first distance $X_{S1-D1}$ that is significantly less than a second distance $X_{S2-D2}$ laterally separating the second source S2 from the second drain D2. In some embodiments, the first distance $X_{S1-D1}$ laterally separating the first source S1 from the first drain D1 is between 10% and 50% of the second distance $X_{S2-D2}$ laterally separating the second source S2 from the second drain D2. In other embodiments, the first distance $X_{S1-D1}$ laterally separating the first source S1 from the first drain D1 is between 50% and 75% of the second distance $X_{S2-D2}$ laterally separating the second source S2 from the second drain D2.

Further still, in this particular exemplary embodiment, the first source S1 and the first gate G1 are laterally separated by a first distance $X_{S1-G1}$ that is significantly less than a second distance $X_{S2-G2}$ laterally separating the second source S2 from the second gate G2. In some embodiments, the first distance $X_{S1-G1}$ laterally separating the first source S1 from the first gate G1 is between 10% and 50% of the second distance $X_{S2-G2}$ laterally separating the second source S2 from the second gate G2. In other embodiments, the first distance $X_{S1-G1}$ laterally separating the first source S1 from the first gate G1 is between 50% and 75% of the second distance $X_{S2-G2}$ laterally separating the second source S2 from the second gate G2. Yet further still, the first gate G1 and the first drain D1 are laterally separated by a first distance $X_{G1-D1}$ that is significantly less than a second distance $X_{G2-D2}$ laterally separating the second gate G2 from the second drain D2. In some embodiments, the first distance $X_{G1-D1}$ laterally separating the first gate G1 from the first drain D1 is between 10% and 50% of the second distance $X_{G2-D2}$ laterally separating the second gate G2 from the second drain D2. In other embodiments, the first distance $X_{G1-D1}$ laterally separating the first gate G1 from the first drain D1 is between 50% and 75% of the second distance $X_{G2-D2}$ laterally separating the second gate G2 from the second drain D2.

Figure 9:
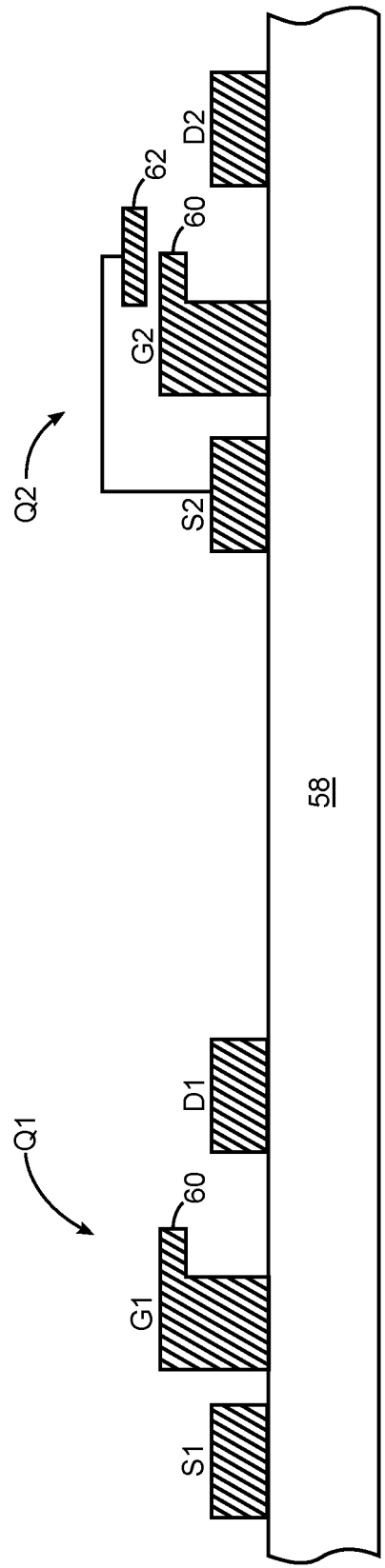
FIG. 9 is a cross-sectional view of the first GaN transistor and the second GaN transistor arranged on the common substrate, wherein the first gate includes a first field plate and the second gate includes a second field plate.

FIG. 9 is a cross-sectional view of the first GaN transistor Q1 and the second GaN transistor Q2 arranged on the common substrate 58, wherein the first gate G1 includes a first field plate 60 making up a single-field plated structure and the second gate G2 includes a second field plate 62 making up a double-field plated structure. As such, the second GaN transistor Q2 has a breakdown voltage that is higher than the breakdown voltage of the first GaN transistor Q1. Therefore, the first GaN transistor Q1 and the second GaN transistor Q2 are configured to operate at different supply voltages. In some embodiments, the first GaN transistor Q1 is configured to operate at a first supply voltage that is no greater than 25% of a second supply voltage for which the second GaN transistor Q2 is configured. In other embodiments, the first GaN transistor Q1 is configured to operate at a first supply voltage that is no greater than 50% of a second supply voltage for which the second GaN transistor Q2 is configured. In yet other embodiments, the first GaN transistor Q1 is configured to operate at a first supply voltage that is no greater than 75% of a second supply voltage for which the second GaN transistor Q2 is configured.

Figure 10:
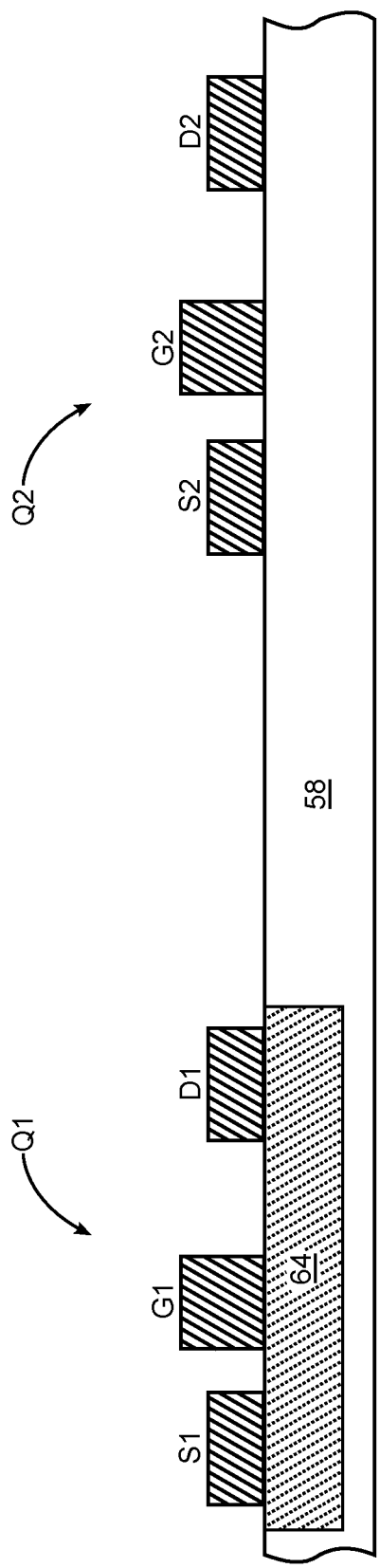
FIG. 10 is a cross-sectional view of the first GaN transistor and the second GaN transistor arranged on the common substrate that includes a channel region that has been epitaxially regrown for the first GaN transistor to provide different electric characteristics that include but are not limited to linear low voltage device operation.

FIG. 10 is a cross-sectional view of the first GaN transistor Q1 and the second GaN transistor Q2 arranged on the common substrate 58 that includes a channel region 64 that has been epitaxially regrown for the first GaN transistor Q1 to provide different electric characteristics such as lower knee characteristic and/or lower breakdown voltage in comparison with a separate channel region (not shown) of the second GaN transistor Q1. The channel region 64 of the first GaN transistor Q1 is made of different materials such as indium aluminum nitride (InAlN) and indium aluminum gallium nitride (InAlGaN) or has a different Al concentration. Moreover, the channel region 64 may have a different thickness than the separate channel region of the second GaN transistor Q2.

Figure 11:
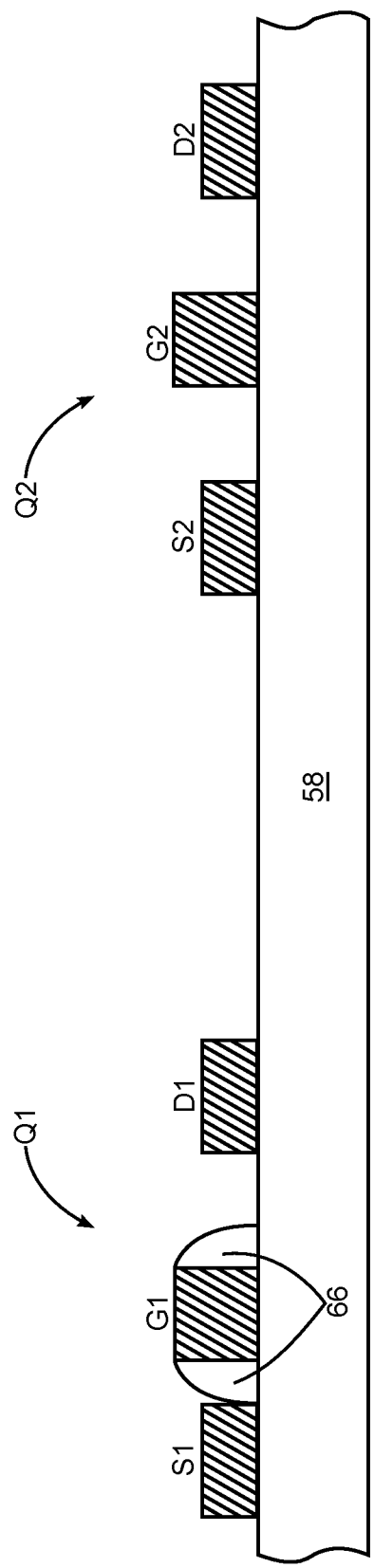
FIG. 11 is a cross-sectional view of the first GaN transistor and the second GaN transistor arranged on the common substrate that includes a self-aligned spacer around the first gate of the first transistor.

FIG. 11 is a cross-sectional view of the first GaN transistor Q1 and the second GaN transistor Q2 arranged on the common substrate 58 that includes a self-aligned spacer 66 around the first gate G1 of the first transistor Q1. The second GaN transistor Q2 does not include a self-aligned spacer.

FIG. 12 is a cross-sectional view of the first GaN transistor Q1 and the second GaN transistor Q2 arranged on the common substrate 58 in which the first source S1 of the first transistor Q1 has an epitaxially regrown contact 68. The epitaxially regrown contact 68 provides enhanced electrical characteristics such as lower resistance for maximized impedance matching.

FIG. 13 is a cross-sectional view of the first GaN transistor Q1 and the second GaN transistor Q2 arranged on the common substrate 58 in which the first source S1 of the first transistor Q1 has an ion implanted contact 70 to provide lower channel resistance and contact resistance for lower knee voltage and drain voltage linear device operation. The ion implanted contact 70 provides enhanced electrical characteristics such as lower resistance for a lower knee voltage and maximized impedance matching. In either exemplary embodiments of FIG. 12 and FIG. 13, drain contacts can also be regrown to provide enhanced electrical characteristics as well. Moreover, all such contacts may be of the ohmic or Schottky types.

The present disclosure describes exemplary embodiments of a cascaded PA topology and a parallel PA topology. However, it is to be understood that the features of this disclosure may be employed to realize multi-stage amplifiers of other types such as a multi-voltage supply segmented distributed amplifier. As such, various embodiments of the present disclosure are deployable in applications such as 5G base-stations, 5G millimeter phased arrays, Wi-Fi 802.11ax, CATV DOCSIS 3.1 Plus, and advanced military and defense communications.

Those skilled in the art will recognize improvements and modifications to the preferred embodiments of the present disclosure. All such improvements and modifications are considered within the scope of the concepts disclosed herein and the claims that follow.

What is claimed is:

1. A gallium nitride (GaN) power amplifier (PA) comprising a plurality of amplifier stages integrated into a monolithic integrated circuit and coupled together between a radio frequency signal input and a radio frequency signal output, wherein at least one of the plurality of amplifier stages includes a first GaN transistor that is configured to have a first breakdown voltage that is no more than 75% of a second breakdown voltage of a second GaN transistor included in a different one of the plurality of amplifier stages; wherein the first GaN transistor has a first drain, a first gate, and a first source with lateral spacing between one another and the second GaN transistor has a second drain, a second gate, and a second source with lateral spacing between one another such that the lateral spacing between at least one of the first drain, the first gate, and the first source is different from the lateral spacing between at least one of the second drain, the second gate, and the second source.

2. The GaN PA of claim 1 wherein the first GaN transistor is configured to operate at a first supply voltage and the second GaN transistor is configured to operate at a second supply voltage that is higher than the first supply voltage.

3. The GaN PA of claim 1 wherein the first GaN transistor has a first gate length and the second GaN transistor has a second gate length that is longer than the first gate length.

4. The GaN PA of claim 1 wherein the first GaN transistor has the first gate and the first source disposed over a substrate and the second GaN transistor has the second gate and the second source disposed over the substrate such that a first lateral spacing between the first gate and the first source is less than a second lateral spacing between the second gate and the second source.

5. The GaN PA of claim 1 wherein the first GaN transistor has the first gate and the first source disposed over a substrate and the second GaN transistor has the second gate and the second source disposed over the substrate such that a first lateral spacing between the first gate and the first source is less than a second lateral spacing between the second gate and the second source, and the first gate has a first gate length that is shorter than a second gate length of the second gate.

6. The GaN PA of claim 1 wherein the first GaN transistor has the first gate and the first drain disposed over a substrate and the second GaN transistor has the second gate and the second drain disposed over the substrate such that a first lateral spacing between the first gate and the first drain is less than a second lateral spacing between the second gate and the second drain.

7. The GaN PA of claim 1 wherein the first GaN transistor has the first gate and the first drain disposed over a substrate and the second GaN transistor has the second gate and the second drain disposed over the substrate such that a first lateral spacing between the first gate and the first drain is less than a second lateral spacing between the second gate and the second drain, and the first gate has a first gate length that is shorter than a second gate length of the second gate.

8. The GaN PA of claim 1 wherein the first GaN transistor has the first drain and the first source disposed over a substrate and the second GaN transistor has the second drain and the second source disposed over the substrate such that a first lateral spacing between the first drain and the first source is less than a second lateral spacing between the second drain and the second source.

9. The GaN PA of claim 1 wherein the first GaN transistor has the first drain, the first gate, and the first source disposed over a substrate and the second GaN transistor has the second drain, the second gate, and the second source disposed over the substrate such that a first lateral spacing between the first drain and the first source is less than a second lateral spacing between the second drain and the second source, and the first gate has a first gate length that is shorter than a second gate length of the second gate.

10. The GaN PA of claim 1 wherein the first GaN transistor has the first drain, the first gate, and the first source disposed over a substrate and the second GaN transistor has the second drain, the second gate, and the second source disposed over the substrate such that a first lateral spacing between the first drain and the first source is less than a second lateral spacing between the second drain and the second source, a third lateral spacing between the first gate and the first source is less than a fourth lateral spacing between the second gate and the second source, a fifth lateral spacing between the first gate and the first drain is less than a sixth lateral spacing between the second gate and the second drain, and the first gate has a first gate length that is shorter than a second gate length of the second gate.

11. The GaN PA of claim 10 wherein the first gate includes a self-aligned spacer.

12. The GaN PA of claim 1 wherein the plurality of amplifier stages is arranged in a cascaded PA topology.

13. The GaN PA of claim 1 wherein the plurality of amplifier stages is arranged in a parallel PA topology.

14. The GaN PA of claim 1 wherein the first transistor includes an epitaxially regrown contact.

15. The GaN PA of claim 14 wherein the epitaxially regrown contact is of the ohmic type.

16. The GaN PA of claim 14 wherein the epitaxially regrown contact is of the Schottky type.

17. The GaN PA of claim 14 wherein the epitaxially regrown contact is a source contact.

18. The GaN PA of claim 14 wherein the epitaxially regrown contact is a drain contact.

19. The GaN PA of claim 1 wherein the first GaN transistor includes an epitaxially regrown channel region comprised of a first type of material that is different from a second type of material comprising a channel region of the second GaN transistor.

20. The GaN PA of claim 1 wherein the first GaN transistor has a single-field plated structure and the second GaN transistor has a double-field plated structure.

21. The GaN PA of claim 1 wherein the first GaN transistor has a first knee voltage that is lower than a second knee voltage of the second GaN transistor.

22. The GaN PA of claim 1 wherein the first GaN transistor a first gate length and the second GaN transistor has a second gate length that is equal to the first gate length within ±1%.

* * * * *